US012753496B2

(12) United States Patent
Lim et al.

(10) Patent No.: US 12,753,496 B2
(45) Date of Patent: Oct. 6, 2026

(54) METHOD FOR CONTROLLING CANISTER TEMPERATURE AND RAW MATERIAL SUPPLY DEVICE

(71) Applicant: JUSUNG ENGINEERING CO., LTD., Gwangju-Si (KR)

(72) Inventors: Byung Gwan Lim, Gwangju-Si (KR); Sang Kyo Kwon, Gwangju-Si (KR); Yong Hyun Kim, Gwangju-Si (KR); Jin Hyun Kim, Gwangju-Si (KR); Hong Eun Kim, Gwangju-Si (KR); Il Houng Park, Gwangju-Si (KR); Chang Kyun Park, Gwangju-Si (KR); In Woo Back, Gwangju-Si (KR); Won Ju Oh, Gwangju-Si (KR); Dong Hwan Lee, Gwangju-Si (KR); Yong Hyun Lee, Gwangju-Si (KR); Jun Seok Lee, Gwangju-Si (KR); Seung Hyun Cho, Gwangju-Si (KR); Jeong Heo, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 143 days.

(21) Appl. No.: 18/574,002

(22) PCT Filed: Jun. 28, 2022

(86) PCT No.: PCT/KR2022/009246
§ 371 (c)(1),
(2) Date: Dec. 22, 2023

(87) PCT Pub. No.: WO2023/277539
PCT Pub. Date: Jan. 5, 2023

(65) Prior Publication Data

US 2024/0318309 A1 Sep. 26, 2024

(30) Foreign Application Priority Data

Jun. 30, 2021 (KR) ........................ 10-2021-0085936

(51) Int. Cl.
*C23C 16/448* (2006.01)
*C23C 16/52* (2006.01)

(52) U.S. Cl.
CPC ............ *C23C 16/448* (2013.01); *C23C 16/52* (2013.01)

(58) Field of Classification Search
None
See application file for complete search history.

(56) References Cited

U.S. PATENT DOCUMENTS

2005/0115945 A1 6/2005 Van Kesteren et al.

FOREIGN PATENT DOCUMENTS

JP H07118862 A 5/1995
JP 2020122194 A 8/2020
(Continued)

OTHER PUBLICATIONS

Machine Translation of KR 2015-0141252 A (Year: 2015).*
(Continued)

*Primary Examiner* — Shamim Ahmed
*Assistant Examiner* — Bradford M Gates
(74) *Attorney, Agent, or Firm* — Renaissance IP Law Group LLP

(57) ABSTRACT

Disclosed are a raw material supply method including vaporizing a raw material in a canister, discharging the vaporized raw material, measuring an inner temperature of the canister, calculating a calculated temperature by using the inner temperature, and compensating a variation of the inner temperature by heating a heating unit disposed on the canister at the calculated temperature and a raw material
(Continued)

supply apparatus applied to the method for supplying the raw material. The raw material supply method and apparatus may stably supply the vaporized raw material to a process space.

9 Claims, 2 Drawing Sheets

(56) References Cited

FOREIGN PATENT DOCUMENTS

| | | | |
|---|---|---|---|
| KR | 20040016186 | A | 2/2004 |
| KR | 20060118239 | A | 11/2006 |
| KR | 20130127028 | A | 11/2013 |
| KR | 20150141252 | A | 12/2015 |
| WO | 2020078860 | A1 | 4/2020 |

OTHER PUBLICATIONS

International Search Report and Written Opinion for PCT/KR2022/009246 mailed Oct. 6, 2022.
Written Opinion for PCT/KR2022/009246 mailed Oct. 6, 2022.

* cited by examiner

METHOD FOR CONTROLLING CANISTER TEMPERATURE AND RAW MATERIAL SUPPLY DEVICE

TECHNICAL FIELD

The present disclosure relates to a method for controlling a temperature of a canister and a raw material supply apparatus, and more particularly, to a method for controlling a temperature of a canister and a raw material supply apparatus, which are capable of stably supplying a vaporized raw material.

BACKGROUND ART

In general, a device used for a semiconductor device and a display apparatus is manufactured by repeating a process of depositing a predetermined material as a thin-film on a substrate and a process of etching the thin-film with a pattern. A method for depositing a thin-film on a substrate includes a physical vapor deposition (PVD) method and a chemical vapor deposition (CVD) method.

Among the methods, the CVD method that deposits a thin-film by vaporizing a raw material and injecting the vaporized raw material onto a substrate is widely used in terms of easy adjustment of a thickness of the thin-film and excellent step coverage.

In general, when the thin-film is formed by the CVD method, the raw material is accommodated in a canister, the raw material is vaporized by heating the canister, and then the vaporized raw material is supplied to a chamber and injected onto the substrate. Here, the vaporized raw material is necessarily supplied with a predetermined supply amount to the chamber in order to maintain a high quality of the thin-film deposited on the substrate.

Here, when the supply amount is hardly adjusted by a flow rate controller due to a low vapor pressure of the raw material, the supply amount of the vaporized raw material is adjusted by controlling a temperature of the canister. For example, as a vaporization amount of the raw material in the canister is constantly maintained by maintaining a temperature of the canister to be greater than a vaporization temperature of the raw material, the vaporized raw material may be supplied from the canister to the chamber with a constant flow rate.

However, at the beginning of supply of the vaporized raw material from the canister to the chamber, an inner pressure of the canister is instantly decreased while the vaporized raw material is instantly discharged from the canister to cause a large amount of vaporization at a surface of the raw material.

Here, as the temperature of the raw material is rapidly decreased by vaporization heat, and a vaporization amount of the raw material is decreased until the temperature of the raw material is restored by the temperature of the canister, the vaporized raw material is hardly supplied from the canister to the chamber with a constant flow rate.

The background technology of the present disclosure is disclosed in the patent document below.

RELATED ART DOCUMENT

Patent Document (Patent document 1) KR10-2006-0118239 A

DISCLOSURE OF THE INVENTIVE CONCEPT

Technical Problem

The present disclosure provides a method for controlling a temperature of a canister and a raw material supply apparatus, which are capable of stably supplying a vaporized raw material.

Technical Solution

In accordance with an exemplary embodiment, a method for controlling a temperature of a canister in a structure of the canister including a measurement unit connected with a control unit and a heating unit connected with the control unit and configured to accommodate a raw material therein includes: measuring an inner temperature of the canister; calculating a calculated temperature by applying the inner temperature of the canister to a calculation equation of the control unit; and changing a temperature of the heating unit into the calculated temperature.

The calculating of the calculated temperature may include deducting the calculation equation on the inner temperature of the canister based on weight values of the inner temperature of the canister and the temperature of the heating unit with respect to a vaporization amount of the raw material, and the weight value of the inner temperature of the canister and the weight value of the temperature of the heating unit with respect to the vaporization amount of the raw material may be different from each other.

The method may further include vaporizing the raw material in the canister and discharging the vaporized raw material, and the measuring of the inner temperature, the calculating of the calculated temperature, and the changing of the temperature of the heating unit into the calculated temperature may be sequentially repeated while the discharging of the vaporized raw material is performed.

The measuring of the inner temperature of the canister may include measuring a temperature of the raw material in the canister as the inner temperature of the canister.

The calculating of the calculated temperature may include producing the calculated temperature by applying a usage rate to a temperature of the raw material.

The calculating of the calculated temperature may include determining the usage rate according to a discharge amount of the vaporized raw material before the producing of the calculated temperature.

The calculated temperature may be produced from a calculation equation 1 below.

$$T_C = (T_{SET} - (T_{ML} \times R_{ML}))/(1 - R_{ML}) \qquad \text{[Calculation equation 1]}$$

(wherein, $T_C$ is a calculated temperature, $T_{SET}$ is a set temperature, $T_{ML}$ is a temperature of the raw material, and $R_{ML}$ is a constant between 0 and 1 as a usage rate of the temperature of the raw material.)

The calculating of the calculated temperature may produce: the calculated temperature from a calculation equation 1 below from a time at which a predetermined reference time elapses after discharging of the vaporized raw material is initiated, and the calculated temperature from a calculation equation 2 below from a time at which the discharging of the vaporized raw material is initiated until the reference time.

$$T_C = (T_{SET} - (T_{ML} \times R_{ML}))/(1 - R_{ML}) \quad \text{[Calculation equation 1]}$$

$$T_C = ((T_{SET} + T_{offset}) - (T_{ML} \times R_{ML}))/(1 - R_{ML}) \quad \text{[Calculation equation 2]}$$

(wherein, $T_C$ is a calculated temperature, $T_{SET}$ is a set temperature, $T_{offset}$ is an offset temperature, $T_{ML}$ is a temperature of the raw material, and $R_{ML}$ is a constant between 0 and 1 as a usage rate of the temperature of the raw material.)

In accordance with another exemplary embodiment, a method for controlling a temperature of a canister in a structure of the canister including a measurement unit connected with a control unit and a heating unit connected with the control unit and configured to accommodate a raw material therein includes: measuring an inner temperature of the canister; comparing and determining the measured inner temperature of the canister and a set temperature of the canister, which is inputted to the control unit; and calculating a calculated temperature by applying the measured inner temperature of the canister to a calculation equation of the control unit.

In accordance with yet another exemplary embodiment, a raw material supply apparatus includes: a canister configured to accommodate a raw material; a heating unit disposed on the canister to heat the raw material in the canister; a measurement unit configured to measure an inner temperature of the canister; and a control unit configured to calculate a calculated temperature by using the inner temperature and change the inner temperature of the canister into the calculated temperature.

The measurement unit may measure a temperature of the raw material in the canister as the inner temperature when discharging of the raw material vaporized in the canister is initiated, and the control unit may produce the calculated temperature by applying a usage rate to the temperature of the raw material.

The control unit may produce the calculated temperature by using one of calculation equations 1 and 2 below according to a time of measuring the inner temperature of the canister.

$$T_C = (T_{SET} - (T_{ML} \times R_{ML}))/(1 - R_{ML}) \quad \text{[Calculation equation 1]}$$

$$T_C = ((T_{SET} + T_{offset}) - (T_{ML} \times R_{ML}))/(1 - R_{ML}) \quad \text{[Calculation equation 2]}$$

(wherein, $T_C$ is a calculated temperature, $T_{SET}$ is a set temperature, $T_{offset}$ is an offset temperature, $T_{ML}$ is a temperature of the raw material, and $R_{ML}$ is a constant between 0 and 1 as a usage rate of the temperature of the raw material.)

Advantageous Effects

In accordance with an exemplary embodiment, the sudden variation of the inner temperature of the canister, which occurs when the vaporized raw material is discharged, may be effectively compensated by measuring the inner temperature of the canister, calculating the calculated temperature from the measured inner temperature, and heating the heating unit disposed on the canister at the calculated temperature while vaporizing and discharging the raw material in the canister.

That is, the inner temperature of the canister may be quickly restored while preventing overshooting by calculating the calculated temperature and using the calculated temperature for heating the heating unit instead of directly using the inner temperature of the canister that is sensitive to the temperature variation.

Thus, the inner temperature of the canister may be quickly stabilized, the vaporization amount of the raw material may be quickly restored, the restored vaporization amount may be stably maintained, and the vaporized raw material may be stably supplied to the process space connected with the canister.

MODE FOR CARRYING OUT THE INVENTIVE CONCEPT

Figure 1:
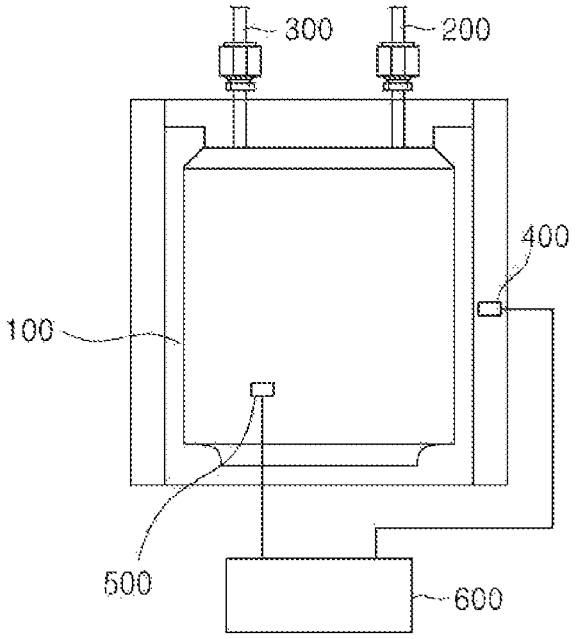
FIG. 1 is a schematic view illustrating a raw material supply apparatus in accordance with an exemplary embodiment.

Hereinafter, exemplary embodiments of the present inventive concept will be described in detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. In the figures, the dimensions of layers and regions are exaggerated for clarity of illustration. Like reference numerals refer to like elements throughout.

A method for controlling a temperature of a canister and a raw material supply apparatus in accordance with an exemplary embodiment, which are a method and an apparatus for vaporizing and supplying all sorts of raw materials onto a substrate, may have various applications. For example, the method for controlling the temperature of the canister and the raw material supply apparatus in accordance with an exemplary embodiment may be applied to a method for controlling a temperature of a canister and a raw material supply apparatus in process equipment of metal organic chemical vapor deposition (MOCVD).

Hereinafter, an exemplary embodiment will be described in detail based on process equipment of vaporizing and supplying a liquid raw material onto a substrate for forming a thin-film.

Firstly, the raw material supply apparatus in accordance with an exemplary embodiment will be described in detail.

FIG. 1 is a schematic view illustrating the raw material supply apparatus in accordance with an exemplary embodiment.

Referring to FIG. 1, the raw material supply apparatus in accordance with an exemplary embodiment includes a canister 100 in which a raw material (not shown) is accommodated, a heating unit 400 for heating the raw material in the canister 100, a measurement unit 500 for measuring an inner temperature of the canister 100, and a control unit 600 for calculating a calculated temperature by using the inner temperature and changing the inner temperature of the canister 100 into the calculated temperature.

Also, the raw material supply apparatus in accordance with an exemplary embodiment may include a discharge unit 200 for connecting the canister 100 to a process chamber (not shown) for processing a substrate (not shown) and a supply unit 300 for supplying the raw material to the canister 100.

The substrate may include a wafer. Alternatively, the substrate may include various substrates such as a glass substrate, a plastic substrate, and a metal substrate.

The process chamber may include a chamber. The chamber may have a predetermined cylindrical shape. The chamber may include a support therein. The substrate may be seated on the support. An injection unit may be disposed in the chamber to face the support.

The injection unit may be connected with the raw material supply apparatus in accordance with an exemplary embodiment. The vaporized raw material may be supplied to the substrate through the injection unit. Thus, a film made of the raw material may be formed on the substrate.

The raw material may include a source for thin-film deposition. The raw material in a liquid phase may be accommodated in the canister 100. Alternatively, the raw material in a solid phase may be provided.

The canister 100 may store the liquefied raw material therein and supply the raw material vaporized therein to the process chamber. The canister 100 may have a hollow cylinder shape. Here, the canister 100 may have various shapes including a rectangular cylinder shape and a cylinder shape.

The canister 100 may be provided in singularity or plurality. Here, the number of the canister 100 may be variously changed. When the canister 100 is provided in plurality, the canister 100 may be connected in parallel to the process chamber. Here, a plurality of canisters 100 may supply the vaporized raw material to a process chamber 10 in a predetermined order. Alternatively, the plurality of canisters 100 may simultaneously supply the vaporized raw material to the process chamber 10.

The discharge unit 200 is connected to one side of an upper portion of the canister 100. Also, the discharge unit 200 may extend to the process chamber and be connected with the injection unit of the process chamber. The discharge unit 200 may have various connection structures.

The supply unit 300 is connected to the other side of the upper portion of the canister 100. Also, the supply unit 300 is connected with a raw material supply source (not shown). The supply unit 300 may receive the raw material from the raw material supply source and supply the received raw material into the canister 100. The supply unit 300 may have various connection structures.

The heating unit 400 includes a heater member having a jacket shape surrounding the canister 100 and a heating member disposed in the heater member to heat the heater member. Alternatively, the heating unit 400 may have various configurations. The heating unit 400 may receive a predetermined current and generate heat in a heat emission method. The heating unit 400 may be mounted to surround a sidewall of the canister 100 and supply emitted heat to the canister 100 to increase the inner temperature of the canister 100. Thus, the raw material in the canister 100 may be heated at, e.g., a temperature higher than a vaporization temperature of the raw material and vaporized in the canister 100, so that the vaporized raw material is produced. Alternatively, the heating unit 400 may have various heat generation methods and installation positions.

The measurement unit 500 is disposed in the canister 100. The measurement unit 500 may be disposed at a predetermined height in the raw material. A method for arranging the measurement unit 500 in the raw material may include various methods. For example, the measurement unit 500 may be supported by a predetermined support member or float in the raw material by attaching a buoyancy member to the measurement unit 500. The measurement unit 500 may measure the inner temperature of the canister 100. The measurement unit 500 may transmit the measured temperature of the raw material to the control unit 600.

Here, the temperature of the raw material, which is measured by the measurement unit 500, may be a temperature around a central portion of the raw material. That is, the measurement unit 500 may measure a temperature of the raw material at a position of receiving heat lastly from the heating unit 400 as the inner temperature of the canister 100.

Also, the temperature of the raw material, which is measured by the measurement unit 500, may be a temperature of the raw material at a predetermined position at which greatest temperature variation occurs when the vaporized raw material is discharged.

Alternatively, a position of the raw material, at which the measurement unit 500 measures the inner temperature of the canister 100, may be variously provided.

The measurement unit 500 may include a temperature sensor. The temperature sensor may be disposed in the canister 100 and submerged into the raw material to measure the temperature of the raw material. The temperature sensor may have various shapes, installation structures, and temperature measurement methods.

The measurement unit 500 may measure the temperature of the raw material continuously or periodically with a predetermined time interval and output the measured temperature.

The control unit 600 calculates the calculated temperature by using the inner temperature of the canister 100, i.e., the temperature of the raw material, and changes the inner temperature of the canister 100 into the calculated temperature. Specifically, the control unit 600 changes the inner temperature of the canister 100 by changing a temperature of the heating unit 400.

The control unit 600 may generate a calculated temperature $T_C$ by applying a usage rate $R_{ML}$ to the temperature of the raw material, which is measured by the measurement unit 500. Here, the usage rage $R_{ML}$ may be referred to as, e.g., a temperature weight factor of the raw material or a temperature weight value of the raw material.

More specifically, the control unit 700 may calculate a calculated temperature by using one of a calculation equation 1 and a calculation equation 2 below according to a measurement time of the temperature of the raw material. For example, a calculated temperature at the beginning of discharge of the vaporized raw material may be calculated by using the calculation equation 2 and a calculated temperature after the beginning of the discharge of the vaporized raw material may be calculated by using the calculation equation 1. The beginning of the discharge of the vaporized raw material may be distinguished by a time or the number of substrates processed in the process chamber 10.

$$T_C = (T_{SET} - (T_{ML} \times R_{ML}))/(1 - R_{ML}) \quad \text{[Calculation equation 1]}$$

$$T_C = ((T_{SET} + T_{offset}) - (T_{ML} \times R_{ML}))/(1 - R_{ML}) \quad \text{[Calculation equation 2]}$$

Here, $T_C$ may represent a calculated temperature, $T_{SET}$ may represent a set temperature, $T_{offset}$ may represent an offset temperature, and $T_{ML}$ may represent a temperature of the raw material. Also, $R_{ML}$ may be a constant between 0 and 1 as the usage rate of the temperature of the raw material.

The set temperature $T_{SET}$ may be determined as a predetermined temperature according to a property of the raw material and a process condition of a process of processing a substrate as a reference temperature of the heating unit, which is set so that a vaporization amount of the raw material in the canister 100 follows a supply amount of the vaporized raw material to be supplied to a substrate. Here, the set temperature $T_{SET}$ may be a predetermined temperature greater than a vaporization temperature of the raw material accommodated in the canister 100.

The offset temperature $T_{offset}$ may be a temperature added in advance to the set temperature $T_{SET}$ as many as a decreased temperature of the raw material in case that the temperature of the raw material is decreased as the vaporization amount suddenly is increased.

For example, the offset temperature $T_{offset}$ may be set such that the temperature of the raw material is measured during a predetermined time from the beginning of the discharge of the vaporized raw material, a lowest temperature among temperatures of the raw material is selected, and a different value between the set temperature $T_{SET}$ and the selected temperature is calculated when a process of vaporizing the raw material and supplying the vaporized raw material onto the substrate is performed.

The usage rate $R_{ML}$ of the temperature of the raw material may be close to 1 as the supply amount of the vaporized raw material supplied from the canister 100 to the process chamber 10 is increased and close to 0 as the supply amount is decreased.

In other words, as the vaporization amount of the raw material at the same predetermined temperature is increased, a value of the usage rate $R_{ML}$ of the temperature of the raw material may be close to 1, and the vaporization amount may be close to 0.

Alternatively, the usage rate $R_{ML}$ of the temperature of the raw material may be determined in another method. For example, according to a degree of a sensitivity of a vapor pressure of the vaporized raw material to the temperature, the value of the usage rate $R_{ML}$ of the temperature of the raw material may be close to 1 as the sensitivity to the temperature is increased and close to 0 as the sensitivity to the temperature is decreased. Here, a feature of being sensitive to a temperature represents a relatively large degree of a vapor pressure variation according to a temperature variation In accordance with an exemplary embodiment, in case of a metal organic chemical vapor deposition process, the usage rate of the temperature of the raw material used for depositing a thin-film may be in a range greater than 0.5 and less than 1, preferably in a range from 0.6 to 0.7.

The usage rate $R_{ML}$ of the temperature of the raw material may be obtained through an experiment. For example, any one constant in a range greater than 0 and less than 1 is selected as an experimental value. Also, the temperature of the raw material is measured while the deposition process using the raw material is repeatedly performed. Also, the calculated temperature is calculated by using the experimental value in a calculation equation instead of the usage rate of the temperature of the raw material, and the heating unit 400 is hated at the calculated temperature. While repeating the above-described series of experiments, a variation according to a time of the temperature of the raw material is observed, and a time at which the temperature of the raw material is close to the set temperature $T_{SET}$ is observed. Also, an experimental value with which the time at which the temperature of the raw material is close to the set temperature $T_{SET}$ is fastest by repeating the above-described experiment while changing the experimental value is determined as the usage rate $R_{ML}$ of the temperature of the corresponding raw material. Thereafter, the usage rate $R_{ML}$ of the temperature for each kind of the raw material may be obtained by repeatedly performing the above-described experiment for each kind of the raw material.

According to the above-described calculation equations, the temperature $T_{ML}$ of the raw material may be maintained to be equal to or greater than the set temperature $T_{SET}$ the vaporized raw material is discharged from the canister 100, and the temperature $T_{ML}$ of the raw material may be lower than the set temperature $T_{SET}$ by the discharge of the vaporized raw material. Here, the calculated temperature $T_C$ calculated from the calculation equations may be greater than the set temperature $T_{SET}$. Thus, the control unit may heat the heating unit 400 at the calculated temperature $T_C$ greater than the set temperature $T_{SET}$.

That is, the control unit 600 may calculate the calculated temperature and increase a heating temperature of the heating unit 400 until the temperature of the raw material, which is decreased when the vaporized raw material is discharged, is recovered to the set temperature, so that the temperature of the raw material is quickly recovered.

Figure 2:
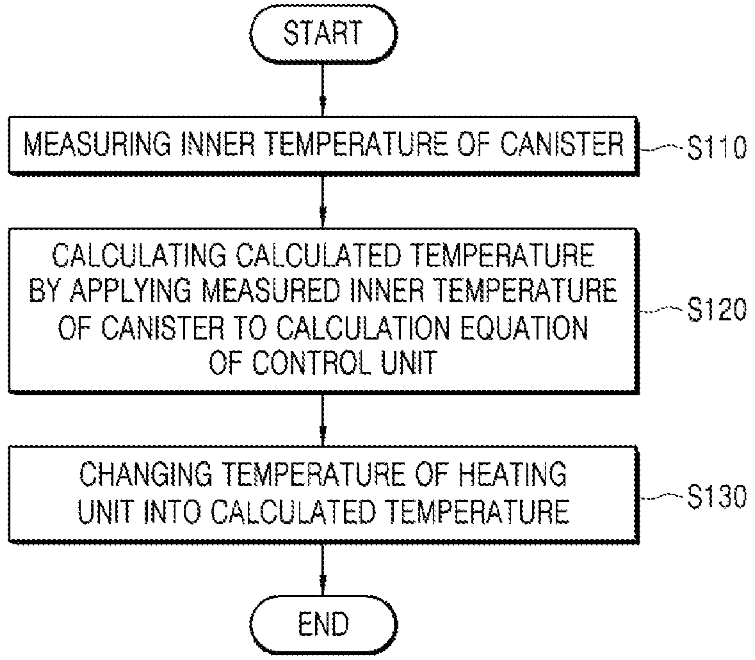
FIGS. 2 and 3 are flowcharts representing a method for controlling a temperature of a canister in accordance with an exemplary embodiment.

FIG. 2 is a flowchart representing a method for controlling a temperature of a canister in accordance with an exemplary embodiment.

Referring to FIGS. 1 and 2, the method for controlling the temperature of the canister in accordance with an exemplary embodiment will be described in detail.

In a structure of a canister 100 including a measurement unit 500 connected with a control unit 600 and a heating unit 400 connected with the control unit 600 and accommodating a raw material therein, the method for controlling the temperature of the canister in accordance with an exemplary embodiment includes a process S110 of measuring an inner temperature of the canister 100, a process S120 of calculating a calculated temperature by applying the inner temperature of the canister 100 to a calculation equation of the control unit 600, and a process S130 of changing the temperature of the heating unit 400 into the calculated temperature.

Here, the method for controlling the temperature of the canister in accordance with an exemplary embodiment may further include a process of vaporizing the raw material in the canister 100 and discharging the vaporized raw material. Also, the method for controlling the temperature of the canister in accordance with an exemplary embodiment may sequentially repeat the process of measuring the inner temperature of the canister 100, the process of calculating the calculated temperature by applying the inner temperature of the canister 100 to the calculation equation of the control unit 600, and the process of changing the temperature of the heating unit 400 into the calculated temperature while performing the process of discharging the vaporized raw material.

The process of vaporizing the raw material in the canister 100 is performed.

Firstly, a supply unit 300 supplies a predetermined amount of the liquid raw material into the canister 100. Thereafter, the raw material is vaporized by heating the heating unit 400 at a set temperature $T_{SET}$. Here, an inner pressure of the canister 100 may be increased by vaporization of the raw material, and the temperature of the raw material may be greater than the set temperature $T_{SET}$.

The process of discharging the vaporized raw material is performed.

The raw material vaporized in the canister 100 is discharged from the canister 100 to a process space in a process chamber by opening a discharge unit 200.

Here, at beginning of the discharge of the vaporized raw material, the vaporized raw material may be rapidly discharged, and the inner pressure of the canister 100 may be rapidly decreased. Thus, while the raw material is rapidly vaporized in the canister 100, the temperature of the raw material is rapidly decreased.

This temperature variation is fastest at a central portion of the raw material or a center of a molten surface of the raw material, gradually slow as a distance to the heating unit 400 is decreased, and slowest around an inner wall of the canister 100 that is closest to the heating unit 400.

While the process of discharging the vaporized raw material is performed, the process of measuring the inner temperature, the process of calculating the calculated temperature, and the process of changing the temperature of the heating unit 400 into the calculated temperature may be sequentially repeated.

Firstly, the process S110 of measuring the inner temperature of the canister 100 is performed.

The temperature of the raw material in the canister 100 may be measured by using the measurement unit 500 as the inner temperature of the canister 100. Here, the temperature of the raw material in the canister 100 may be measured by using the measurement unit 500 as the inner temperature of the canister 100. The measured temperature of the raw material may be outputted to the control unit 600.

Thereafter, the process S120 of calculating the calculated temperature by applying the measured inner temperature to the calculation equation of the control unit 600 is performed, and the process S130 of changing the temperature of the heating unit 400 into the calculated temperature is performed.

The process of calculating the calculated temperature may include a process of deducing a calculated temperature of the inner temperature of the canister based on weight values of the inner temperature of the canister and the temperature of the heating unit with respect to a vaporization amount of the raw material.

Here, the weight values of the inner temperature of the canister and the temperature of the heating unit with respect to a vaporization amount of the raw material represent a value of a degree in which a degree of variation of the inner temperature of the canister and a degree of variation of the temperature of the heating unit affect a variation of the vaporization amount of the respective raw material. For example, the vaporization amount of the raw material is affected by the inner temperature of the canister and the temperature of the heating unit. Here, each weight value may be obtained by comparing varied vaporization amounts of the raw material in a case of changing the inner temperature of the canister and in a case of changing the temperature of the heating unit in a state in which the inner temperature of the canister is equal to the temperature of the heating unit.

The method of changing the inner temperature of the canister may be variously provided. For example, a method of adjusting an inner pressure of the canister or a method of injecting a raw material having an adjusted temperature may be used.

Here, a weight value of the inner temperature of the canister and a weight value of the temperature of the heating unit with respect to the vaporization amount of the raw material may be different. Specifically, the weight value of the inner temperature of the canister may be greater. The usage rate may be determined by using the respective weight value, the calculation equation may be deduced by using the usage rate, and a calculated temperature TC may be calculated by putting the measured inner temperature of the canister into the calculation equation.

However, the method for determining the usage rate may be variously provided.

That is, a usage rate $R_{ML}$ may be determined according to a discharge amount of the vaporized raw material, and the calculated temperature $T_C$ may be calculated by applying the usage rate $R_{ML}$ to the temperature of the raw material.

For example, the feature of determining the usage rate $R_{ML}$ according to the discharge amount of the vaporized raw material may determine the usage rate $R_{ML}$ to be a value close to 1 as the discharge amount of the vaporized raw material is increased and to be a value close to 0 as the discharge amount of the vaporized raw material is decreased. Here, the discharge amount of the vaporized raw material may represent a determined supply amount of the vaporized raw material from the canister 100 to the process chamber. For example, the discharge amount of the raw material that has a great variation in vaporization amount by sensitively reacting with a temperature variation may be greater than that of the raw material that has a small variation in vaporization amount at the same temperature. Thus, when the temperature of the vaporized raw material to be supplied to the chamber is determined, the usage rate $R_{ML}$ of the raw material that has a greater vaporization amount at the corresponding temperature may be determined as a value close to 1, and the usage rate $R_{ML}$ of the raw material that has a smaller vaporization amount at the corresponding temperature may be determined as a value close to 0. The usage rate $R_{ML}$ may be obtained through a predetermined experiment that repeatedly measuring the vaporization amount while vaporizing various kinds of raw materials at various temperatures in the canister having the same condition.

A calculation equation 1 below may be deduced by using the usage rate, and a calculated temperature may be produced from the calculation equation 1 below.

$$T_C = (T_{SET} - (T_{ML} \times R_{ML}))/(1 - R_{ML}) \qquad \text{[Calculation equation 1]}$$

Here, $T_C$ is the calculated temperature, $T_{SET}$ is the set temperature, $T_{ML}$ is the temperature of the raw material, and $R_{ML}$ is a constant between 0 and 1 as the usage rate of the temperature of the raw material.

Also, the calculated temperature may be produced from the calculation equation 1 from a time at which a predetermined reference time elapses after the discharge of the vaporized raw material is initiated, and the calculated temperature may be produced from a calculation equation 2 below from a time at which the discharge of the vaporized raw material is initiated until the reference time.

$$T_C = ((T_{SET} + T_{offset}) - (T_{ML} \times R_{ML}))/(1 - R_{ML}) \quad \text{[Calculation equation 2]}$$

Here, $T_C$ is the calculated temperature, $T_{SET}$ is the set temperature, $T_{offset}$ is an offest temperature, $T_{ML}$ is the temperature of the raw material, and $R_{ML}$ is a constant between 0 and 1 as the usage rate of the temperature of the raw material.

For example, in a condition in which the set temperature $T_{SET}$ is 59°, the usage rate $R_{ML}$ of the temperature of the raw material is 0.6, and the offset temperature $T_{offset}$ is 1, when the temperature $T_{ML}$ of the raw material is 57° at a predetermined time (a first time) between the time at which the discharge of the vaporized raw material is initiated and the reference time, the calculated temperature $T_C$ may be 64.3° by using the calculation equation 2. Thus, the control unit 600 may increase the temperature of the heating unit 400 from 59° to 64.3°, and the drop of the temperature $T_{ML}$ of the raw material may be quickly compensated.

Likewise, when the temperature $T_{ML}$ of the raw material is 57.5° at a second time after the first time between the time at which the discharge of the vaporized raw material is initiated and the reference time, the calculated temperature $T_C$ may be 63.75° by using the calculation equation 2. Thus, the control unit 600 may adjust the temperature of the heating unit 400 from 64.3° to 63.75°, and the drop of the temperature $T_{ML}$ of the raw material may be quickly compensated while preventing the temperature $T_{ML}$ of the raw material from overshooting.

Figure 3:
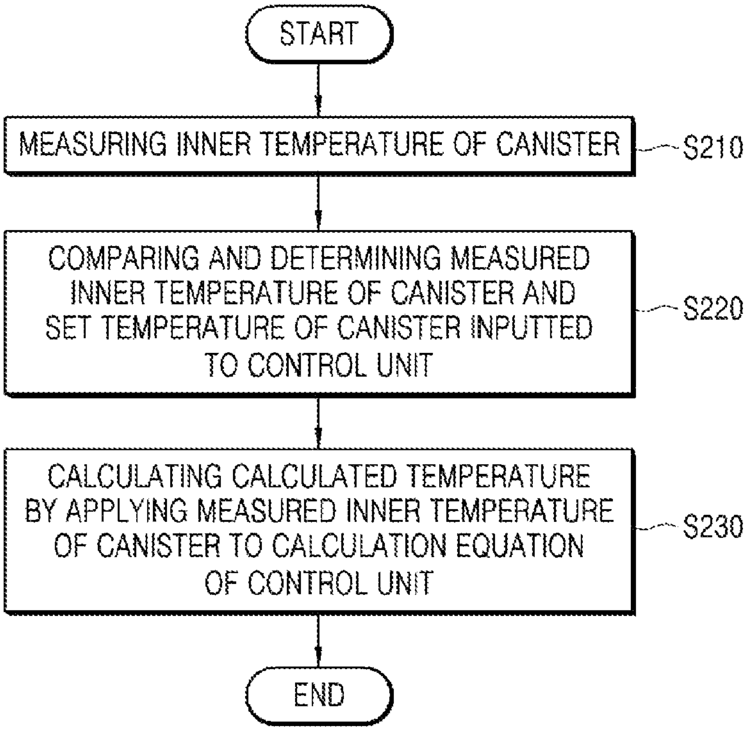

As described above, the calculated temperature $T_C$ may be calculated by using the calculation equation 1 or 2 while consecutively or periodically measuring the temperature $T_{ML}$ of the raw material, and the temperature of the raw material may be quickly converged to the set temperature $T_{SET}$ by heating the heating unit 400 to the calculated temperature. Thus, the temperature of the raw material in the canister 100 may be stably maintained at the set temperature, and a film may be formed with a constant thickness in a film deposition process using the vaporized raw material. FIG. 3 is a flowchart representing a method for controlling a temperature of a canister in accordance with a modified embodiment.

Referring to FIGS. 1 and 3, in a structure of a canister 100 including a measurement unit 500 connected with a control unit 600 and a heating unit 400 connected with the control unit 600 and accommodating a raw material therein, a method for controlling a temperature of a canister in accordance with a modified embodiment includes a process S210 of measuring an inner temperature of the canister, a process S220 of comparing and determining the measured inner temperature of the canister and a set temperature of the canister, which is inputted to the control unit, and a process S230 of calculating a calculated temperature by applying the measured inner temperature of the canister to a calculation equation of the control unit. That is, the method for controlling the temperature of the canister in accordance with a modified embodiment may further include a process S220 of comparing and determining the measured inner temperature of the canister and the set temperature of the canister, which is inputted to the control unit, between the process of measuring the inner temperature of the canister and the process of calculating the calculated temperature.

Since the process S210 of measuring an inner temperature of the canister and the process S230 of calculating the calculated temperature are the same as the process S110 of measuring the inner temperature and the process S120 of calculating the calculated temperature in accordance with an exemplary embodiment, descriptions thereof will be omitted below.

The process S220 of comparing and determining the measured inner temperature of the canister and the set temperature of the canister, which is inputted to the control unit, is performed.

That is, the inner temperature of the canister, which is measured in the measurement unit 500, and the set temperature of the canister, which is inputted to the control unit, are compared with each other. Here, the set temperature of the canister may be equal to a reference temperature of the heating unit, which is set so that a vaporization amount of the raw material in the canister 100 follows a supply amount of the vaporized raw material to be supplied to a substrate. That is, the set temperature of the canister may correspond to the set temperature TSET described in an exemplary embodiment.

When two temperatures are equal to each other as a result of comparison, the method for controlling the temperature of the canister may be returned to process S210 of measuring the inner temperature of the canister without performing the process S230 of calculating the calculated temperature. When two temperatures are different from each other as the result of comparison, the process S230 of calculating the calculated temperature may be performed, and then the process of changing the temperature of the heating unit into the calculated temperature may be performed.

Also, while the processes from the process S210 of measuring the inner temperature of the canister to the process S220 of comparing and determining the measured inner temperature of the canister and the set temperature of the canister, which is inputted to the control unit, are performed, the raw material vaporized in the canister may be supplied or may not be supplied to the chamber.

Figure 4:
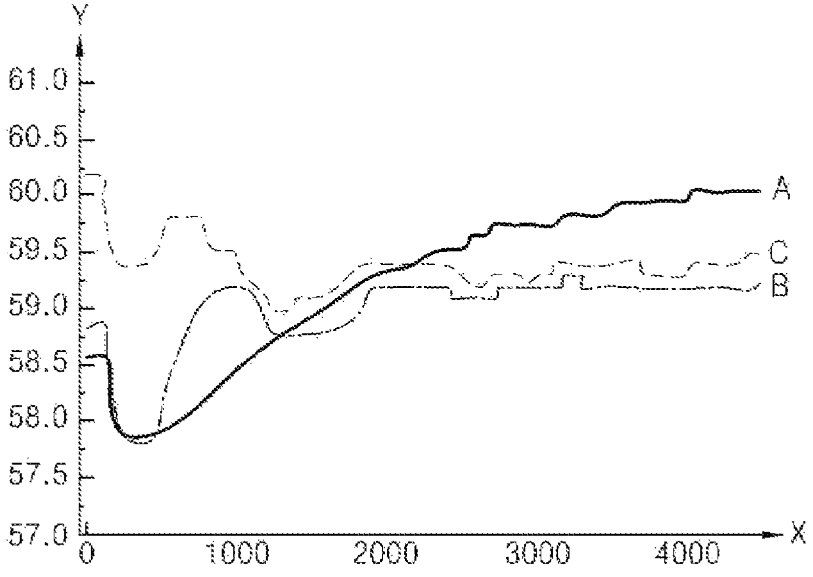
FIG. 4 is a graph obtained by comparing, with a comparative example, measured results of a temperature of a raw material while supplying the raw material and controlling a temperature of the canister in the method for controlling the temperature of the canister in accordance with an exemplary embodiment.

FIG. 4 is a graph obtained by comparing, with a comparative example, measured results of the temperature of the raw material while supplying the raw material with the method for supplying the raw material in accordance with an exemplary embodiment.

The raw material is supplied while the film deposition process is performed using the raw material supply apparatus in accordance with an exemplary embodiment. Here, a temperature variation of the raw material in the canister is shown in the graph.

Likewise, the raw material is supplied while the film deposition process is performed using the raw material supply apparatus in accordance with a comparative example. Here, a temperature variation of the raw material in the canister is shown in the graph.

Here, a measurement unit of the raw material supply apparatus in accordance with a comparative example measures a temperature of a sidewall of the canister instead of an inner temperature of the canister, and a control unit controls a temperature of a heating unit in a method of heating or cooling the temperature of the heating unit as many as a difference between the temperature of the sidewall of the canister, which is measured by the measurement unit, and a set temperature that is set in advance.

Here, a X-axis of the graph of FIG. 4 represents a discharge time of the vaporized raw material, and a unit thereof is a second. Also, a Y-axis of the graph of FIG. 4 represents a temperature of the raw material, and a unit thereof is a Celsius temperature (° C.). Here, the set temperature of each of the exemplary embodiment and the comparative example is 59° C.

FIG. 4 shows a temperature variation according to a time of the raw material in the canister in the film deposition process in accordance with the comparative example. Curves B and C of FIG. 4 shows a temperature variation according to a time of the raw material in the canister in the film deposition process in accordance with the exemplary embodiment. Here, the curve C of FIG. 4 shows a case in which an offset temperature is applied to the calculation equation at the beginning of the discharge by distinguishing the discharge time of the vaporized raw material into the beginning of the discharge and a period after the beginning of the discharge.

It may be known that a comparative example A shows that the temperature of the raw material takes a long time to be returned to the set temperature and overshoots more than the set temperature in comparison with embodiments B and C.

It may be also known that the embodiments shows that the temperature of the raw material is quickly returned to the set temperature and stably maintain the set temperature while suppressing overshooting in comparison with the comparative example.

As described above, in accordance with an exemplary embodiment, the inner temperature of the canister may be prevented from overshooting and quickly restored to the set temperature by calculating the calculated temperature and using the calculated temperature in heating of the heating unit instead of directly using the inner temperature of the canister that is sensitive to the temperature variation.

The foregoing embodiments of the present inventive concept are intended to illustrate the present inventive concept, not to limit the present inventive concept. It should be noted that the configurations and method disclosed in the embodiments of the present inventive concept may be combined and varied in various forms by combining or crossing each other, and their modifications may also be considered within the scope of the present inventive concept. That is, the present inventive concept will be embodied in a variety of different forms within the scope of the appended claims and equivalent technical spirits, and it should be understood by those skilled in the art to which the present inventive concept pertains that the present inventive concept can be implemented in various embodiments within the scope of the technical spirit of the present inventive concept.

What is claimed is:

1. A method for controlling a temperature of a canister in a structure of the canister comprising a measurement unit connected with a control unit and a heating unit connected with the control unit and configured to accommodate a raw material therein, comprising:

measuring an inner temperature of the canister;

calculating a calculated temperature by applying the inner temperature of the canister to a calculation equation of the control unit; and changing a temperature of the heating unit into the calculated temperature, wherein the measuring of the inner temperature of the canister comprises measuring a temperature of the raw material in the canister as the inner temperature of the canister, wherein the calculated temperature is produced from a calculation equation 1 below.

$$T_C = (T_{SET} - (T_{ML} \times R_{ML}))/(1 - R_{ML}) \quad \text{[Calculation equation 1]}$$

(wherein, $T_C$ is a calculated temperature, $T_{SET}$ is a set temperature, $T_{ML}$ is a temperature of the raw material, and $R_{ML}$ is a constant between 0 and 1 as a usage rate of the temperature of the raw material).

2. The method of claim 1, wherein the calculation equation is based on weight values of the inner temperature of the canister and the temperature of the heating unit with respect to a vaporization amount of the raw material, wherein the weight value of the inner temperature of the canister and the weight value of the temperature of the heating unit with respect to the vaporization amount of the raw material are different from each other.

3. The method of claim 1, further comprising vaporizing the raw material in the canister and discharging a vaporized raw material, wherein the measuring of the inner temperature, the calculating of the calculated temperature, and the changing of the temperature of the heating unit into the calculated temperature are sequentially repeated while the discharging of the vaporized raw material is performed.

4. The method of claim 1, wherein the usage rate is determined according to a discharge amount of the vaporized raw material.

5. A method for controlling a temperature of a canister in a structure of the canister comprising a measurement unit connected with a control unit and a heating unit connected with the control unit and configured to accommodate a raw material therein, comprising:

measuring an inner temperature of the canister;

comparing and determining the measured inner temperature of the canister and a set temperature of the canister, which is inputted to the control unit; and calculating a calculated temperature by applying the measured inner temperature of the canister to a calculation equation of the control unit, wherein, as a result of the comparing and determining, when the inner temperature and the set temperature are different from each other, performing the calculating of the calculated temperature by applying the inner temperature to the calculation equation of the control unit, and when the inner temperature and the set temperature are equal to each other, returning to the measuring of the inner temperature without performing the calculating of the calculated temperature.

6. A method for controlling a temperature of a canister in a structure of the canister comprising a measurement unit connected with a control unit and a heating unit connected with the control unit and configured to accommodate a raw material therein, comprising:

measuring an inner temperature of the canister;

calculating a calculated temperature by applying the inner temperature of the canister to a calculation equation of the control unit; and changing a temperature of the heating unit into the calculated temperature, wherein the measuring of the inner temperature of the canister comprises measuring a temperature of the raw material in the canister as the inner temperature of the canister, wherein the calculating of the calculated temperature produces:

the calculated temperature from a calculation equation 1 below from a time at which a predetermined reference time elapses after discharging of a vaporized raw material is initiated, and the calculated temperature from a calculation equation 2 below from a time at which the discharging of the vaporized raw material is initiated until the reference time:

$$T_C = (T_{SET} - (T_{ML} \times R_{ML}))/(1 - R_{ML}) \quad \text{[Calculation equation 1]}$$

$$T_C = ((T_{SET} + T_{offset}) - (T_{ML} \times R_{ML}))/(1 - R_{ML}) \quad \text{[Calculation equation 2]}$$

(wherein, $T_C$ is a calculated temperature, $T_{SET}$ is a set temperature, $T_{offset}$ is an offset temperature, $T_{ML}$ is a temperature of the raw material, and $R_{ML}$ is a constant between 0 and 1 as a usage rate of the temperature of the raw material).

7. The method of claim 6, wherein the calculation equation is based on weight values of the inner temperature of the canister and the temperature of the heating unit with respect to a vaporization amount of the raw material, wherein the weight value of the inner temperature of the canister and the weight value of the temperature of the heating unit with respect to the vaporization amount of the raw material are different from each other.

8. The method of claim 6, further comprising vaporizing the raw material in the canister and discharging a vaporized raw material, wherein the measuring of the inner temperature, the calculating of the calculated temperature, and the changing of the temperature of the heating unit into the calculated temperature are sequentially repeated while the discharging of the vaporized raw material is performed.

9. The method of claim 6, wherein the usage rate is determined according to a discharge amount of the vaporized raw material.

* * * * *